United States Patent [19]
Ismail

[11] Patent Number: 5,966,617
[45] Date of Patent: Oct. 12, 1999

[54] MULTIPLE LOCAL OXIDATION FOR SURFACE MICROMACHINING

[75] Inventor: M. Salleh Ismail, Moorpark, Calif.

[73] Assignee: Kavlico Corporation, Moorpark, Calif.

[21] Appl. No.: 08/717,024

[22] Filed: Sep. 20, 1996

[51] Int. Cl.$^6$ ................................................. H01L 21/465
[52] U.S. Cl. ........................... 438/443; 438/286; 438/304
[58] Field of Search ................... 438/286, 447, 438/304, 443

[56] References Cited

U.S. PATENT DOCUMENTS

| | | | |
|---|---|---|---|
| 3,506,502 | 4/1970 | Nakamura | 148/174 |
| 4,426,768 | 1/1984 | Black et al. | 29/583 |
| 4,495,820 | 1/1985 | Shimada et al. | 73/724 |
| 4,516,316 | 5/1985 | Haskell | 29/576 W |
| 4,554,726 | 11/1985 | Hillenius et al. | 29/571 |
| 4,571,661 | 2/1986 | Hoshino | 361/283 |
| 4,658,279 | 4/1987 | Guckel | 357/26 |
| 4,812,888 | 3/1989 | Blackburn | 357/26 |
| 4,861,420 | 8/1989 | Knutti et al. | 156/633 |
| 4,894,698 | 1/1990 | Hijikigawa et al. | 357/26 |
| 4,926,696 | 5/1990 | Haritonidis et al. | 73/205 |
| 4,975,390 | 12/1990 | Fujii et al. | 437/228 |
| 5,095,401 | 3/1992 | Zavracky et al. | 361/283 |
| 5,103,279 | 4/1992 | Gutteridge | 357/25 |
| 5,126,812 | 6/1992 | Greiff | 357/25 |
| 5,155,061 | 10/1992 | O'Connor et al. | 437/86 |
| 5,164,328 | 11/1992 | Dunn et al. | 437/54 |
| 5,187,986 | 2/1993 | Takebe et al. | 73/766 |
| 5,264,075 | 11/1993 | Zanini-Fisher et al. | 156/633 |

(List continued on next page.)

FOREIGN PATENT DOCUMENTS

| | | |
|---|---|---|
| 0-194-953-A-1 | 9/1986 | European Pat. Off. . |
| 62-120051 | 1/1987 | Japan . |
| 2 242 313 | 9/1991 | United Kingdom . |
| WO 83 01536 | 4/1983 | WIPO . |
| WO 85 05737 | 12/1985 | WIPO . |

OTHER PUBLICATIONS

Nathanson, H.C. and R.A. Wickstrom, "A Resonant–Gate Silicon Surface Transistor With High–Q Band–Pass Properties," Applied Physics Letters, vol. 7, No. 4, Aug. 15, 1965, pp. 84–86.

Sprenkels et al., A Theoretical Analysis of the Electret Air–Gap field–Effect Structure for Sensor Applications, Sensors and Actuators, Sep., 1986, pp. 59–72.

Steinbruchel, Christoph, "The Mechanical Field Effect Transistor: A New Force Sensor," J. Vac. Sci. Technol. A 7(3), May/Jun. 1989, pp. 847–849.

Bengtsson, Stefan, "Semiconductor Wafer Bonding: A Review of Interfacial Properties and Applications," Journal of Elec. Materials, vol. 21, No. 8, 1992, pp. 841–862.

Graf et al., "Silicon Membrane Condenser Microphone with Integrated Field–Effect Transistor," Sensors and Actuators A, 37–38, 1993, pp. 708–711.

Howe et al., Silicon Micromechanics: Sensors and Actuators on a Chip, IEEE Spectrum, Jul., 1990, pp. 29–31.

*Primary Examiner*—Chandra Chaudhari
*Assistant Examiner*—David S Blum
*Attorney, Agent, or Firm*—Skjerven, Morrill, MacPherson, Franklin & Friel LLP; Norman R. Klivans; David T. Millers

[57] ABSTRACT

A multiple LOCOS (local oxidation) process shapes a surface of a substrate to form a series of planar regions which are vertically separated from each other. One exemplary process forms a hard mask layer for each LOCOS operation. Another exemplary process includes forming a silicon nitride mask layer and repeatedly changing the pattern of that mask layer. Each change in the pattern corresponds to a planar region to be formed; and after each change, oxide is grown in openings through the mask layer. The growth of oxide consumes part of the substrate and provides a vertical separation between the planar level corresponding to the pattern and a next higher planar level. Regions of the substrate once exposed by a mask pattern can remain exposed so that subsequent LOCOS operations maintain previously established separations between levels. A hard mask layer can include a polysilicon layer which protect a silicon nitride layer from conversion to oxide during the repeated LOCOS operations.

14 Claims, 6 Drawing Sheets

U.S. PATENT DOCUMENTS

| | | | |
|---|---|---|---|
| 5,316,619 | 5/1994 | Mastrangelo | 156/644 |
| 5,329,110 | 7/1994 | Shimabukuro et al. | 250/207 |
| 5,349,492 | 9/1994 | Kimura et al. | 361/283.4 |
| 5,374,583 | 12/1994 | Lur | 438/447 |
| 5,472,916 | 12/1995 | Bertagnolli et al. | 437/228 |
| 5,576,251 | 11/1996 | Garabedian | 438/286 |
| 5,578,843 | 11/1996 | Garabedian et al. | 257/254 |

MULTIPLE LOCAL OXIDATION FOR SURFACE MICROMACHINING

CROSS-REFERENCE TO RELATED APPLICATION

This patent document is a related to and incorporates by reference U.S. Pat. No. 5,576,251, filed Feb. 22, 1995, which is a divisional of U.S. Pat. No. 5,578,843 filed Oct. 6, 1994.

BACKGROUND OF THE INVENTION

1. Field of the Invention

This invention relates to semiconductor device manufacturing and particularly to processes for shaping a surface of a semiconductor substrate for fabrication of an integrated micromachine sensor.

2. Description of Related Art

Local oxidation (LOCOS) processes are well known for forming thick (typically 5000 Å to 10,000 Å) oxide isolation areas known as field oxide. In a typical LOCOS process, a silicon nitride layer formed on the surface of a silicon substrate is patterned to create openings which expose parts of the substrate. The substrate is then heated in the presence of oxygen to grow the field oxide in the openings. The nitride layer is then be stripped, and conventional integrated circuit elements such as transistors are formed in and on areas of the substrate separated from each other by the field oxide.

Micromachines such as accelerometers and pressure sensors which have mechanical elements can be integrated with conventional circuit elements on silicon substrates. Forming such micromachines often requires shaping the surface to the substrate to form depressions and/or cavities. Some methods for forming depressions and cavities etch a silicon substrate, for example, with a potassium hydroxide (KOH) isotropic silicon etch or dry plasma etching, but these procedures typically leave residues, rough surfaces, or defects that make surfaces unsuitable for active integrated circuit elements or fusion bonding. Accordingly, methods for forming smooth, defect-free contoured surfaces are sought.

SUMMARY OF THE INVENTION

In accordance with the invention, a local oxidation (LOCOS) process shapes the surface of a substrate. The LOCOS process forms a mask layer on the surface of the substrate, patterns the mask layer to create openings in the mask layer where depressions in the substrate are desired, and forms oxide regions in a process that consumes a portion of the substrate exposed by the mask layer. After an oxide region is formed and then removed, a depression is left in the area in which the oxide region was formed. The surface in the depression is smooth and relatively defect-free and is suitable for formation of active regions for a micromachine sensor or integrated circuitry.

In accordance with one embodiment of the invention, multiple LOCOS processes form a set of levels on the surface of a substrate. Each LOCOS process uses a mask having a pattern associated with a level. For example, a first mask pattern exposes regions of a substrate associated with a lowest surface level. Silicon dioxide is grown in regions exposed by the first mask, and the mask and the grown silicon dioxide are removed to leave depressions in the substrate. A second mask can then be formed and patterned to expose regions of a substrate associated with the previously formed depressions and areas of the substrate associated with a next higher level. Silicon dioxide is grown in the regions exposed by the second mask, and removing the second mask and grown silicon dioxide leaves depressions at least two different depths. The LOCOS processes can be repeated to form many different levels. Using two mask patterns where all of the regions exposed by the first mask pattern are also exposed by the second mask pattern forms a three level surface including a low plane in areas exposed by the first and second masks, a middle plane in areas exposed only by the second mask, and a high plane in areas covered by both masks.

In accordance with another embodiment of the invention, a single mask layer is formed and then patterned multiple times. A first pattern for the mask layer has openings where a first or lowest level of the surface of the substrate is desired. Growing oxide in the openings through the mask layer formed for the first pattern consumes part of the substrate where lowest level of the substrate's surface is desired. A second pattern for the mask layer expands the openings formed through the mask layer for the first pattern or creates new openings through the mask layer. The additional area of the substrate exposed by the second pattern but not exposed by the first pattern defines a second level of the substrate's surface. Growing oxide after forming the second pattern for the mask layer consumes more of the substrate both in the areas of the lowest level and the second level. The process of patterning the mask layer and growing oxide can be repeated until a desired number of surface levels are created.

In a typical application, the mask layer is made of silicon nitride. Silicon nitride is partly converted to silicon dioxide during oxide growth.

Accordingly, the thickness of the silicon nitride layer can be adjusted according to the number of mask patterns (or LOCOS processes) for which the silicon nitride layer is used. Alternatively, to avoid formation of very thick silicon nitride layers, a mask layer can initially include a layer of polysilicon deposited on a silicon nitride layer. Oxide growth consumes the polysilicon layer during the LOCOS processes, but the polysilicon protects the silicon nitride from consumption. The thickness of the polysilicon layer can be selected so that the polysilicon is entirely converted to silicon dioxide. The same etching that removes grown silicon dioxide from the substrate also removes the silicon dioxide formed from the polysilicon in the mask layer.

For one process in accordance with the invention, oxide growth for one pattern of the mask layer is removed before growing oxide for the next pattern, and the thickness of oxide grown for each pattern determines a vertical separation between a level defined by one pattern and a level defined by the next pattern. In an alternative process, oxide growth accumulates in multiple growth steps for a series of patterns.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a surface of a substrate is shaped using LOCOS (local oxidation) processes. The LOCOS processes leave smooth defect-free surfaces which are suitable for formation of active integrated circuit elements and for fusion bonding. One process in accordance with the invention shapes a silicon substrate to provide three or more planar levels. The process uses a single nitride mask layer patterned multiple times for multiple oxide growth steps. A first pattern for the nitride layer has one or more openings over what will be the lowest level of the substrate's surface. Oxide is grown in the openings and removed to leave depressions in the silicon substrate. Openings through the silicon nitride mask layer can then be added or expanded for a next growth of oxide. Oxide growth and removal deepens the previously formed depressions and forms new shallower depressions where openings were added or expanded. The added or expanded portions of the openings define a next higher level of the substrate's surface. Successive patterning of the mask layer and growth and removal of oxide forms a series of surface levels.

Figure 1:
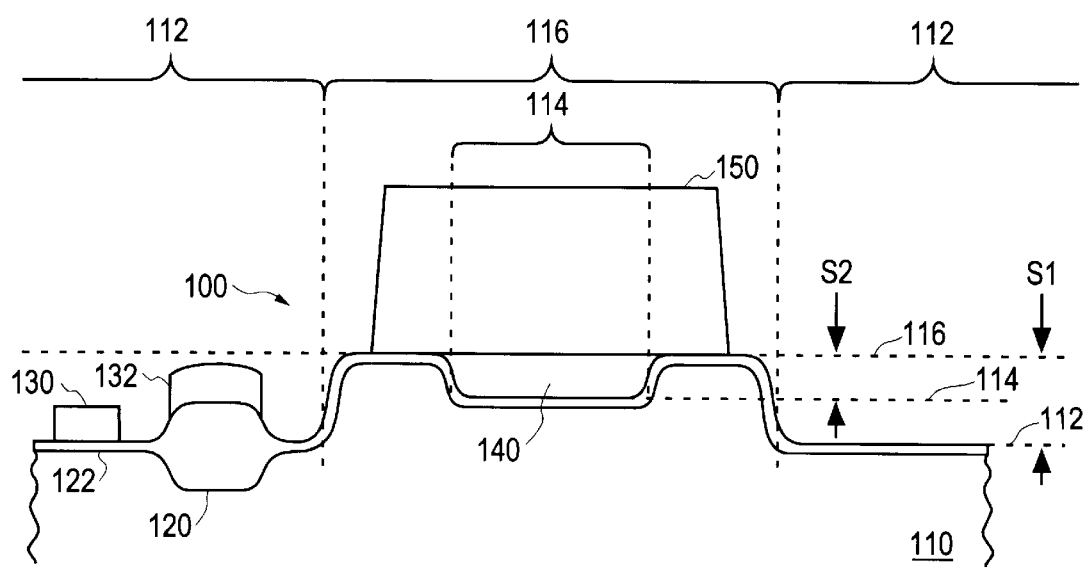
FIG. 1 shows a cross-sectional view of a micromachine sensor in accordance with an embodiment of the invention.

FIG. 1 shows a sensor 100 formed in and on a silicon substrate 110. A surface of silicon substrate 110 includes three planar levels, a high plane 116 to which a flexible structure 150 is fusion bonded, a middle plane 114 in which active regions affected by motion of flexible structure 150 are formed, and a low plane 112 in and on which conventional integrated circuit elements are formed. U.S. Pat. No. 5,598,843, entitled "Semiconductor Sensor with a Fusion Bonded Flexible Structure", which is hereby incorporated by reference in its entirety describes sensors similar to sensor 100 and processes such as fusion bonding required for forming such sensors.

A vertical separation S1 between high plane 116 and low plane 112 is critical during manufacture of sensor 100. In particular, high plane 116 must be the highest surface available for fusion bonding, and all circuit elements built on substrate 110 prior to fusion bonding must lie below the level of high plane 116. Additionally, to avoid damage to fragile portions of flexible structure 150, semiconductor fabrication steps requiring an ambient temperature of more than 900° C. should be completed before the fusion bonding process. To achieve, these goals vertical separation S1 must accommodate the thickness of structures such as fieldoxide 120 and polysilicon regions 130 and 132 formed in and on low plane 112 by high temperature processes. In a typical application, field oxide 120 may be 8500 Å thick and extend 4500 Å above low plane 112. A polysilicon layer in a typical application may be 5000 Å thick and form a gate region 130 and an interconnect region 132 for transistors and other active circuitry formed in low plane 112. The separation S1 between low plane 112 and high plane 116 should be greater than the combined height of field oxide 120 and interconnect region 132 because interconnects (region 132) may overlie field oxide 120. Accordingly, a typical separation S1 is on the order of 1 μm.

A vertical separation S2 between high plane 116 and middle plane 114 is critical to the operation of sensor 100. Separation S2 defines the size of a cavity 140 and the distance between flexible structure 150 and active regions formed in middle plane 114. Separation S2 should be selected to optimize performance of micromachine sensor 100. In particular, separation S2 should accommodate the maximum extension of flexible structure 150 into cavity 140 and should position active regions formed at the bottom of cavity 140 at an optimal distance from flexible structure 150. In a typical sensor, separation S2 is about 2400 Å.

Figure 2A:
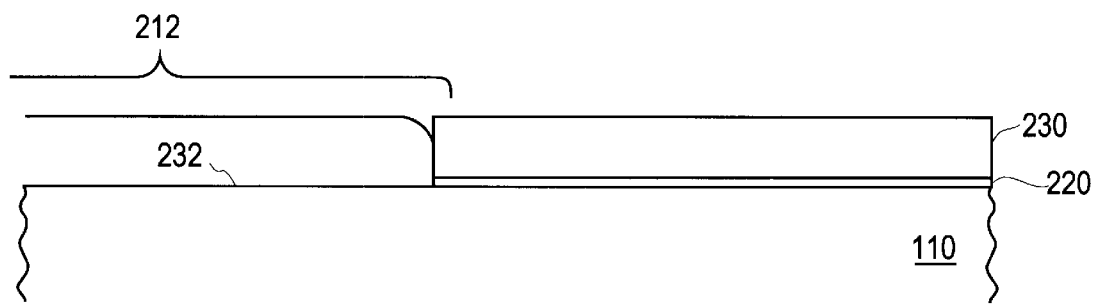
FIGS. 2A, 2B, 2C, 2D, 2E, 2F, 2G, 2H, and 2I show cross-sections of a semiconductor substrate during a process which shapes the surface of the substrate using multiple masks and LOCOS operations.
Figure 2B:
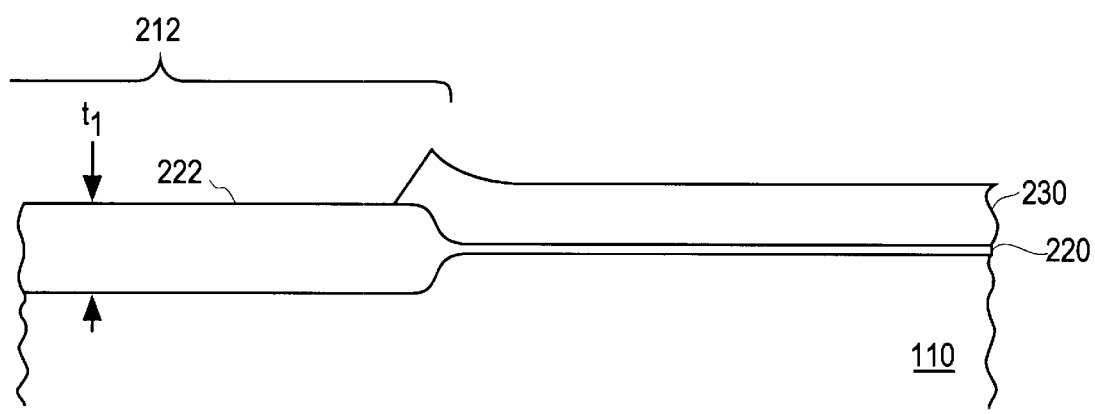

FIGS. 2A to 2I illustrate a process for shaping the surface of silicon substrate 110 and forming field oxide regions 120 for isolation of active circuit elements. FIG. 2A shows substrate 110 after forming and patterning of a silicon nitride mask layer 230 which is sufficiently thick to protect covered portions of the surface of substrate 110 from a subsequent oxidation process. Silicon nitride layer 230 can be deposited using low pressure chemical vapor deposition (LPCVD) or plasma enhanced chemical vapor deposition (PECVD) to a thickness of about 1000 Å to 3000 Å on a pad oxide layer 220 which is typically about 100 Å to 500 Å thick. Pad oxide layer 220 protects substrate 110 from the etching process which patterns silicon nitride layer 230 and reduces stress at the interface of silicon nitride layer 230 and silicon substrate 110. Silicon nitride mask layer 230 is patterned by masking and etching using photoresist and conventional photolithography techniques to form an opening 232 through silicon nitride layer 230 over area 212 of silicon substrate 110. Area 212 is where the lowest level of the surface of substrate 110 will reside once contouring of substrate 110 is complete.

After photoresist removal and cleaning steps, substrate 110 is heated to about 1000° C. to 1200° C. in the presences of oxygen, wet oxygen, or an oxygen-hydrogen mix at atmospheric pressure to grow an oxide region 222 to a thickness t1 in opening 232. The temperature, pressure, ambient, and duration for oxide growth is adjusted to provide the desired thickness t1. For example, if thickness t1 is 17,000 Å, a temperature of about 1150° C. can be applied for about 30,000 seconds in the presence of oxygen and hydrogen at one atmosphere pressure. As is well known growth of silicon dioxide consumes silicon to a depth about 0.45 times the thickness t1 of silicon dioxide region 222. Growth of silicon dioxide region 222 also extends under silicon nitride layer 230. Boundaries of opening 232 are accordingly offset (by about 85% of the oxide thickness) from the desired boundaries of area 212.

Figure 2C:
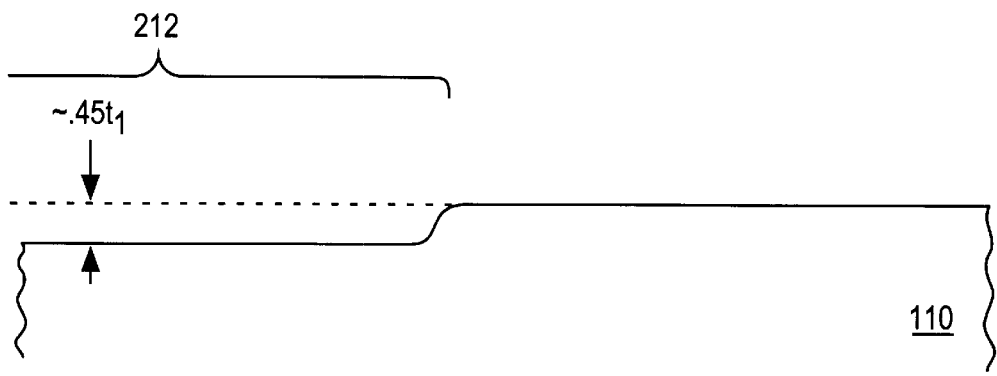

FIG. 2C shows substrate 110 after removal of silicon nitride layer 230, silicon dioxide region 222, and pad oxide layer 220. Silicon nitride layer 230 can be stripped off using a dry plasma etch or hot phosphoric acid which is selective to silicon dioxide. Silicon dioxide region 222 and pad layer 220 can then be removed using a buffered oxide etch or hydrofluoric acid which is selected to silicon. Silicon nitride and oxide can also be stripped simultaneously in concentrated hydrofluoric acid that is selective to silicon. Silicon substrate 110 at the point shown in FIG. 2C has a depression of depth of about 0.45 times thickness t1 in area 212. For the exemplary embodiment, thickness t1 is 17,000 Å, and the depression is about 7600 Å deep.

Figure 2D:
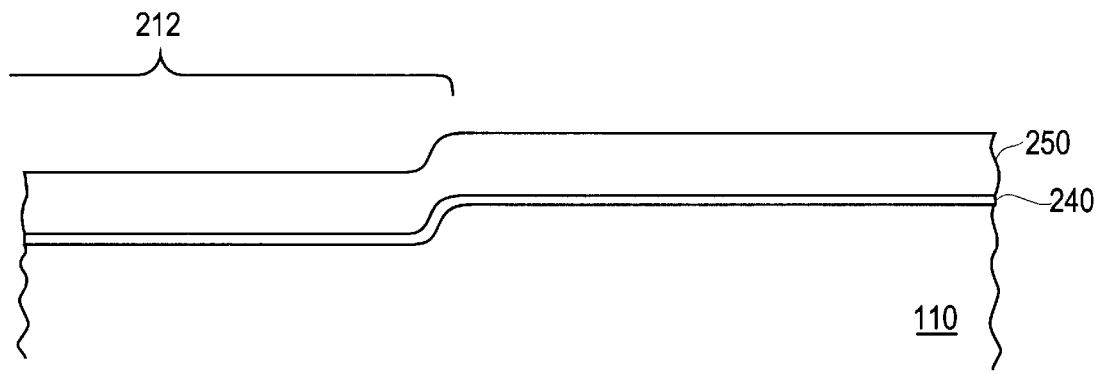
Figure 2E:
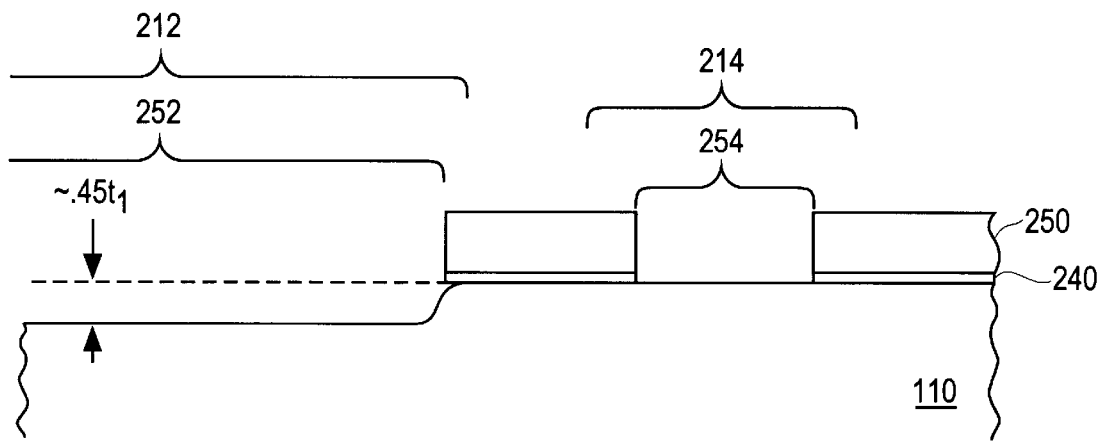
Figure 2F:
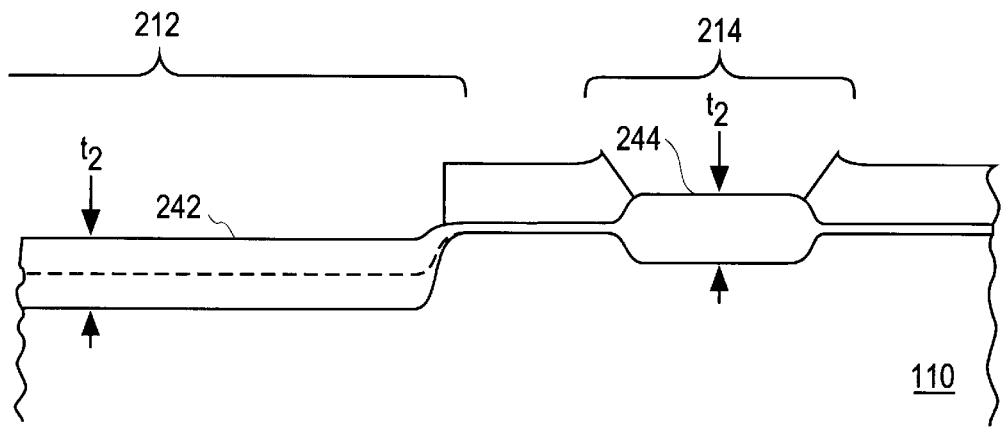

A pad oxide layer 240 and a silicon nitride layer 250 as shown in FIG. 2D are formed on substrate 110 for formation of a second mask for a second LOCOS operation. Conventional mask and etch processes pattern silicon nitride layer 250 to form openings 252 and 254 as shown in FIG. 2E in areas 212 and 214 of substrate 110. Opening 254 controls boundaries of middle plane 114 which is the next higher level from low plane 112. Opening 252 exposes the depression previously formed in substrate 110. Substrate 110 is again subjected to high temperature in the presences of oxygen to grow silicon dioxide regions 242 and 244 in respective openings 252 and 254 as shown in FIG. 2F.

The time, temperature, and pressure used for oxide growth control a thickness t2 of regions 242 and 244 and consumes a portion of silicon substrate 110 to a depth of about 0.45 times t2 thickness.

Figure 2G:
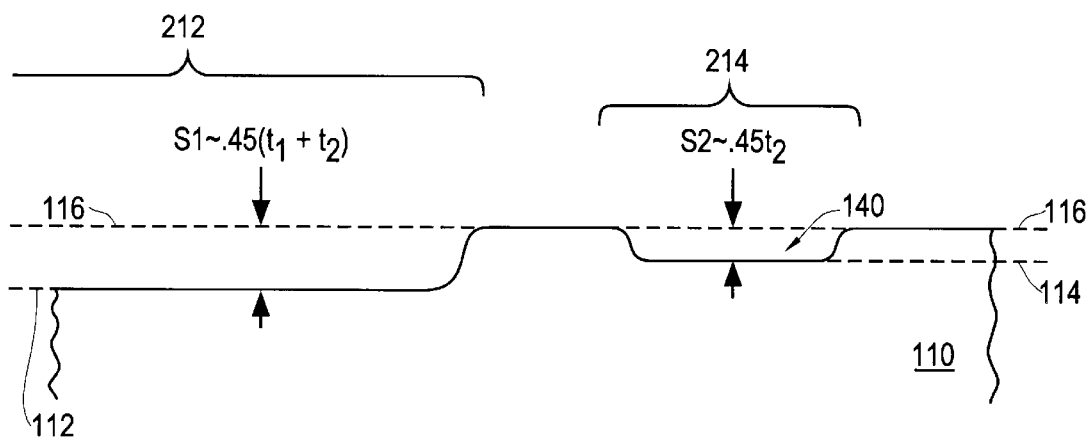

FIG. 2G shows substrate 110 after removal of silicon nitride layer 250 and silicon dioxide regions 242 and 244. The portion of substrate 110 that was covered during the both LOCOS operations is approximately at the level of the original surface of substrate 110 and forms high plane 116. Removal of silicon dioxide region 244 forms middle plane 114 which is vertically offset from high plane 116 by separation S2. Separation S2 depends on the amount of silicon consumed in forming in silicon dioxide region 244 and is about 0.45 times thickness t2. In the exemplary embodiment, thickness t2 is about 5300 Å, and middle plane 114 is offset about 2400 Å from high plane 116. Formation and removal of oxide region 242 increases the depth of the depression previously formed in area 212. Low plane 112 is the bottom of the depression deepened by removal of silicon dioxide region 242. The vertical separation S1 from high plane 116 to low plane 112 depends on the total thickness of silicon consumed in forming silicon dioxide regions 222 and 242. Formation and removal of region 242 increases the depth of the depression in area 212 by about 45% of the thickness of oxide region 242 for a total depth of 0.45 times the sum of thicknesses t1 and t2. In the exemplary embodiment where thickness t1 is about 17,000 Å and thickness t2 is about 5300 Å, low plane 112 is offset about 1 $\mu$m from high plane 116.

In accordance with an aspect of the invention, the thicknesses t1 and t2 of oxide regions are selected according to desired vertical separations between planar levels on the surface of substrate 110. In particular, thickness t1 is the desired separation (S1–S2) between low plane 112 and middle plane 114 divided by the fraction (0.45) of thickness of oxide region 242 resulting from consumption of substrate 110. Thickness t2 is the desired separation (S2) between middle plane 114 and high plane 116 divided by the fraction (0.45) of thickness of oxide region 244 resulting from consumption of substrate 110. Forming and patterning silicon nitride layers, oxidizing silicon exposed by openings through the silicon nitride layers, and removing the oxide regions formed can be repeated two, three, or more times to create three, four, or more different planar levels on the surface of substrate 110. If each mask exposes depressions previously formed, formation and removal of oxide regions preserves previous vertical separations between levels because the depths of depressions in all exposed areas increase by the same amount.

Figure 2H:
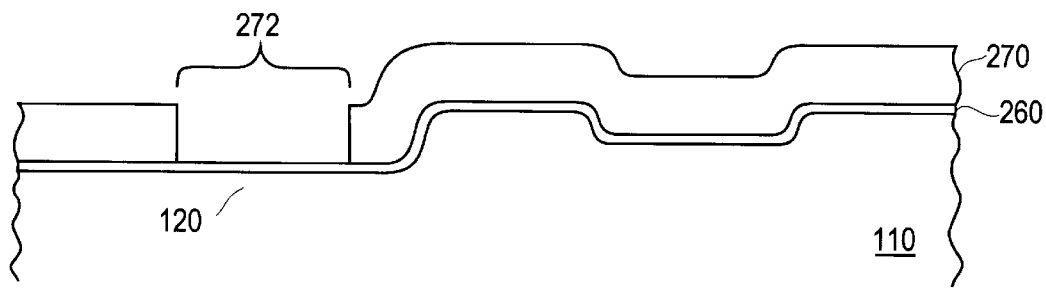
Figure 2I:
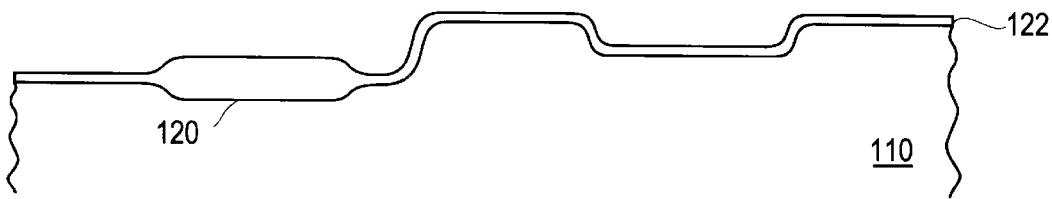

After the desired contours are formed on the surface of substrate 110, conventional processes can form isolation wells (not shown) and field oxide regions. FIGS. 2H and 2I illustrate a LOCOS process which forms field oxide region 120. In the LOCOS process, a pad oxide layer 260 and a silicon nitride layer 270 are formed on the contoured surface of substrate 110. Silicon nitride layer 270 is then patterned to form an opening 272 where field oxide 120 is desired. Field oxide 120 is then grown in the openings after which silicon nitride layer 270 is removed.

A bond/gate oxide layer 122 is formed for subsequent fusion bonding of flexible structure 150 to high plane 166. Conventional processing can forms active circuitry in low plane 112 and middle plane 114 and active regions for a micromachine sensor in middle plane 114 or low plane 112.

Once the necessary high temperature processes for formation of active circuitry are complete, flexible structure 150 is fusion bonded to high plane 116. An advantage of shaping substrate 110 using the LOCOS operations is rounded corners that result at the transitions for high plane 116 to low plane 112 or middle plane 114. The rounded corners reduce stress caused when flexible structure 150 flexes. Also, layers and interconnect structures more easily follow the contour of the rounded corners causing interconnect structures which pass between levels to be more reliable than interconnects which traverse sharp transitions between levels.

Figure 3A:
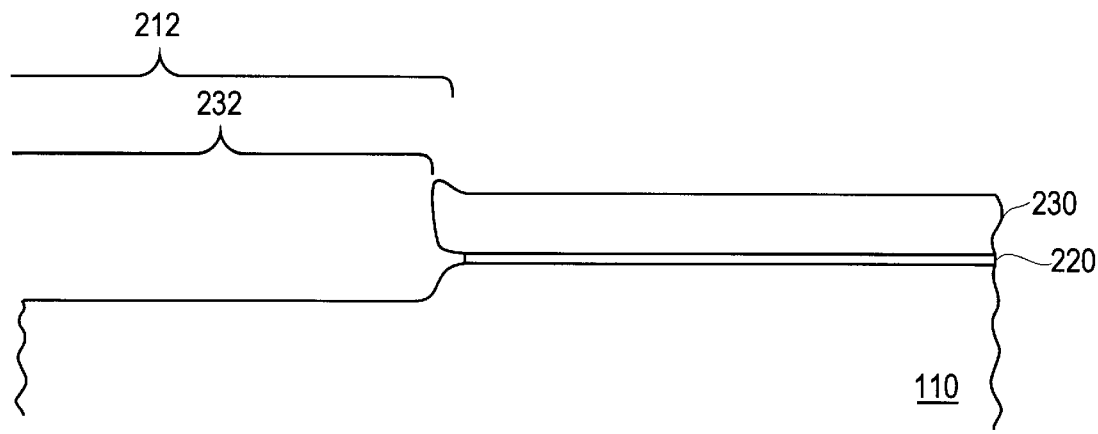
FIGS. 3A, 3B, and 3C show cross-sections of a semiconductor substrate during a process which shapes the surface of the substrate using a single mask and multiple LOCOS operations.

As an alternative to forming separate mask layers for each LOCOS operations described in regard to FIGS. 2A to 2I, silicon nitride layer 230 can be patterned multiple times for multiple LOCOS operations. Initial steps of this alternative process proceeds as described above in regard to FIGS. 2A and 2B. However, instead of removing silicon nitride layer 230 as shown in FIG. 2C, the alternative process removes oxide region 222 but retains and repatterns silicon nitride layer 320 as shown in FIG. 3A. An etch such as buffered oxide etch (BOE) or buffered hydrofluoric acid (BHF) which is selective to silicon and silicon nitride is applied to the structure of FIG. 2B and provides the structure shown in FIG. 3A. At this point, silicon substrate 110 has a depression of depth of about 0.45 times thickness t1 in area 212.

After removal of local oxide regions 222, silicon nitride layer 230 is repatterned by conventional mask and etch processes to form an opening 334 through silicon nitride layer 230 over an area 214 of substrate 110. Opening 334 controls boundaries of middle plane 114 which is the next higher level from low plane 112. If a step at the level of middle plane 114 were desired adjacent to low plane 112, repatterning silicon nitride layer 230 can expand opening 232 to expose a portion of substrate 110 adjacent the depression in area 212.

Figure 3B:
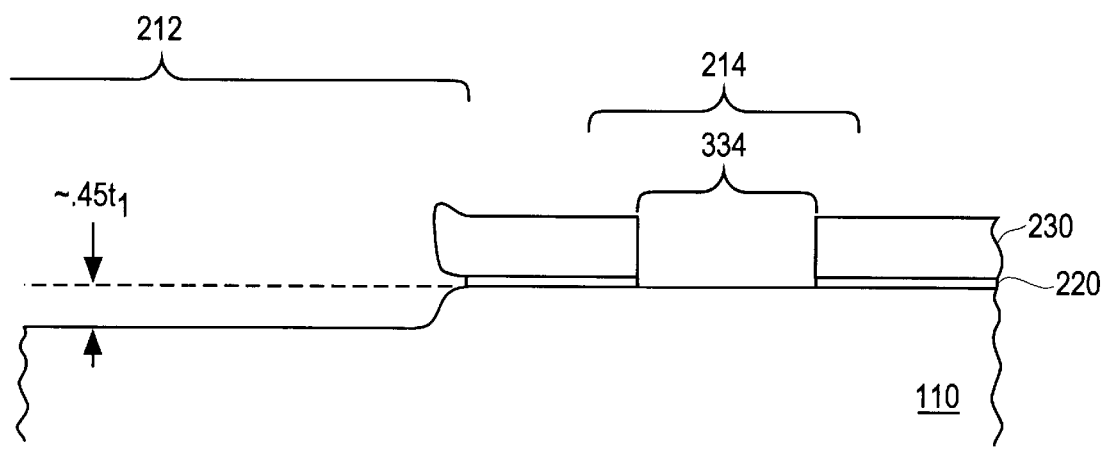
Figure 3C:
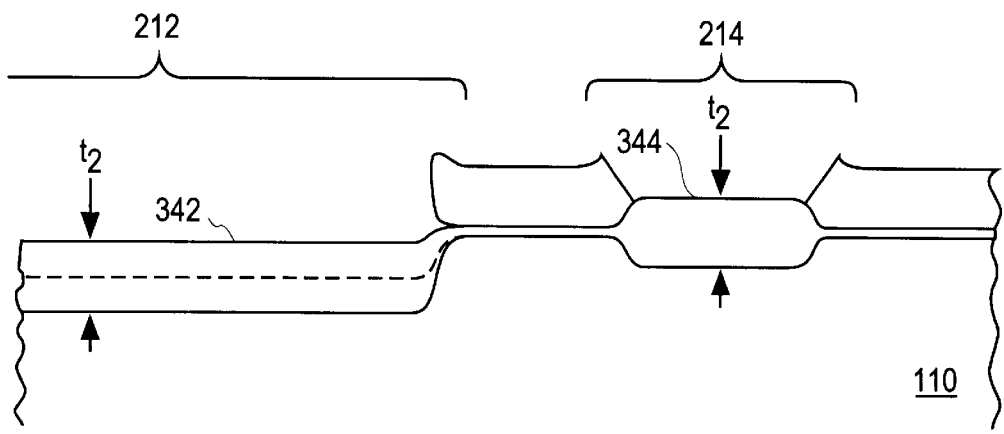

After repatterning silicon nitride mask layer 230, substrate 110 is again heated in the presences of oxygen to grow silicon dioxide regions 342 and 344 in respective openings 232 and 334 as shown in FIG. 3C. The time, temperature, and gas pressure used for oxide growth control thickness t2 of regions 342 and 344. Formation and removal of oxide region 342 increases the depth of the depression previously formed in area 212 by region 342. No misalignment of the two LOCOS operations in low plane 112 occur since opening 232 controls the boundaries both oxide regions 222 and 342.

Patterning silicon nitride layer 230, oxidizing silicon exposed by openings through the silicon nitride layer 230, and removing the oxide regions formed can be repeated two, three, or more times to create three, four, or more different planar levels on the surface of substrate 110. If the vertical separation between adjacent levels is so large that growth of a sufficiently thick oxide region is impractical, oxide growth and removal sequence can be repeated without repatterning silicon nitride layer 230. Multiple growths and removals of silicon dioxide regions in an opening form a depression having the same depth as a depression formed by growth and removal of a single silicon dioxide region having the accumulate thickness of the multiple silicon dioxide regions.

As an alternative to removing, silicon dioxide region 222 before forming silicon dioxide regions 342 and 344, silicon dioxide layer 222 can be left intact while silicon nitride layer 230 is repatterned and silicon dioxide region 344 is grown. Silicon dioxide region 222 thickens while silicon dioxide region 344 grows. Eliminating an etch step decreases the number of processing steps required to shape the surface of substrate 110. A disadvantage of not removing oxide regions before a following oxidation process is that the growth rate of oxide depends upon the thickness of oxide already grown, so that oxide region 222 generally increases in thickness by less than the thickness t2 of oxide region 344. Determining the thickness t1 required to provide the desired separation between low plane 112 and middle plane 114 must account for the variable rates of oxide growth which becomes increasingly more complex if the oxide remains intact through several oxide growth processes.

After removal of silicon nitride layer 230, silicon dioxide regions 342 and 344, and pad layer 220 of FIG. 3C, substrate 110 has the same contour as shown in FIG. 2G, and processing of substrate 110 can continue as described in regard to FIGS. 2H and 2I. The process steps illustrated in FIGS. 3A to 3C have an advantage over the process steps illustrated in FIGS. 2C to 2F in that additional silicon nitride and pad oxide layers are not required for each LOCOS operation. However, silicon nitride layer 230 must be thicker for the process of FIGS. 3A to 3C because each LOCOS operation oxidizes some of silicon nitride layer 230. For example, to grow silicon dioxide region 222 to a thickness of 17000 Å, requires about 510 minutes in an oxygen-hydrogen ambient at 1150° C. which converts about 700 Å of silicon nitride layer 230 to silicon dioxide. Subsequent oxidation to form region 344 to a thickness of about 5400 Å takes about 105 minutes in an oxygen-hydrogen ambient at 1000° C. which converts about 50 Å more silicon nitride to silicon dioxide. In addition to being exposed to two oxidations, silicon nitride layer 230 is exposed to an oxide etches which removes region 222. Accordingly, for the process steps of FIGS. 2C to 2F a thickness of about 1000 Å and 1200 Å is adequate for silicon nitride layer 230; but for the process including the steps illustrated in FIGS. 3A to 3C, silicon nitride layer 230 should be greater than about 1500 Å thick to survive two oxidations. Even thicker silicon nitride is required if layer 230 is repatterned more than once.

Figure 4A:
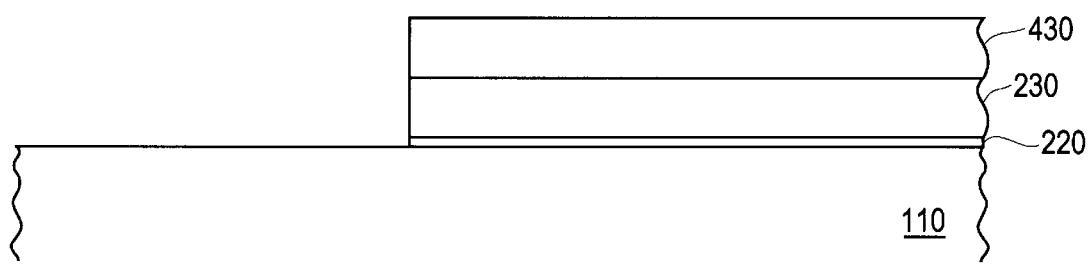
FIGS. 4A and 4B show cross-sections of a hard mask which initially includes a polysilicon layer that is consumed in one or more LOCOS operations.

In accordance with another aspect of the invention, a mask layer includes a polysilicon layer deposited over a silicon nitride layer to reduce the required silicon nitride thickness. FIG. 4A illustrates a mask layer formed by depositing or growing pad oxide layer 220 on substrate 110, depositing silicon nitride layer 230 on pad oxide layer 220, and depositing a polysilicon layer 430 on silicon nitride layer 230. Typical polysilicon deposition is by LPCVD, and the thickness of polysilicon layer 430 is selected so that polysilicon layer 430 is entirely consumed by oxidation but substantially protects silicon nitride layer 230 from conversion to silicon dioxide. For example, polysilicon layer 430 can be slightly thinner than about 0.45 times thickness of the local oxide formed in substrate 110.

Polysilicon layer 430 and silicon nitride layer 230 are patterned using a single mask layer of photoresist. A typical etching for polysilicon and silicon nitride and is a dry plasma etch using sulfur hexafluoride and oxygen for polysilicon and freon ($CF_4$) and oxygen for silicon nitride.

Figure 4B:
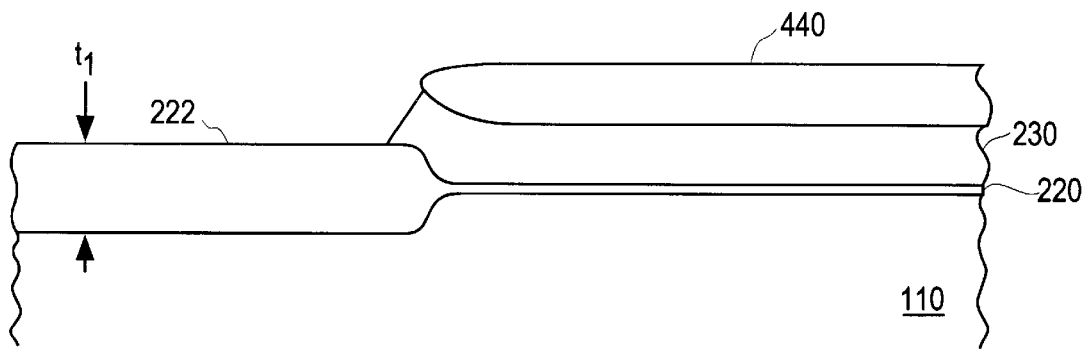

After patterning the hard mask layer, the structure is cleaned and thermal oxide is grown to the desired thickness. FIG. 4B shows an example where a LOCOS operation grows silicon dioxide to a thickness which entirely consumes polysilicon layer 430 leaving a silicon dioxide region 440 on silicon nitride layer 230. Silicon dioxide regions 440 and 222 are removed with, for example, buffered or dilute hydrofluoric acid. In one embodiment, polysilicon layer 430 is thinner than the thickness of silicon consumed from substrate 110 so that silicon dioxide region 440 is thinner than oxide region 222 by about the thickness of pad oxide layer 220 (about 100 Å to 500 Å). A controlled oxide etch leaves an oxide layer that protects substrate 110 during subsequent repatterning of silicon nitride layer 230. Removing oxide regions 222 and 440 produces a structure as shown in FIG. 3A which can be further processed as described above.

Although the invention has been described with reference to particular embodiments, the description is only an example of the invention's application and should not be taken as a limitation. For example, although a process in accordance with the invention was described in the context of forming a micromachine sensor, other applications of the invention include general shaping of the surface of a substrate for any purpose. Various other adaptations and combinations of features of the embodiments disclosed are within the scope of the invention as defined by the following claims.

I claim:

1. A process for shaping a surface of a substrate, comprising:

forming a mask layer covering the surface of the substrate;

patterning the mask layer to create openings over a first portion of the substrate;

growing oxide on the first portion of the substrate;

repatterning the mask layer to create openings over a second portion of the substrate;

growing oxide on the first and second portions of substrate as exposed by patterning and repatterning of the mask layer; and removing oxide regions from surface of the substrate, wherein removal of the oxide leaves depressions in the surface of the substrate caused by part of the substrate being consumed in the growing of the oxide regions.

2. The process of claim 1, further comprising removing oxide from the first portion of the substrate after growing oxide on the first portion of the substrate and before growing oxide on the first and second portions of the substrate.

3. The process of claim 1, wherein growing oxide on the first and second portions of the substrate thickens the oxide previously grown on the first portion of the substrate.

4. The process of claim 1, wherein substrate comprises silicon.

5. The process of claim 4, wherein forming the mask layer comprise forming a layer of silicon nitride overlying the silicon substrate.

6. The process of claim 5, wherein forming the mask layer further comprises forming a polysilicon layer overlying the silicon nitride layer.

7. The process of claim 6, wherein the polysilicon layer has a thickness such that the polysilicon layer is entirely consumed in the step of growing oxide.

8. The process of claim 1, wherein growing oxide comprises heating the substrate in the presence of oxygen, wherein the mask layer restricts growth of oxide to regions where openings are formed through the mask layer.

9. The process of claim 1, wherein patterning the mask layer comprises forming a first set of openings through the mask layer.

10. The process of claim 9, wherein repatterning the mask layer comprises forming a second set of openings through the mask layer, so that the mask layer has a pattern including the first set of openings and the second set of openings.

11. The process of claim 9, wherein repatterning the mask layer comprises expanding at least one of the openings in the first set.

12. The process of claim 11, wherein repatterning the mask layer further comprises forming a second set of openings through the mask layer.

13. A method for shaping a surface of a substrate, comprising:

forming a mask layer on the surface of the substrate;

etching through part of the mask layer;

heating the substrate in the presence of oxygen to form oxide on portions of the substrate exposed by etching through the mask layer;

removing the oxide to leave a depression in the substrate; and repeating the etching, heating, and removing steps one or more times using the same mask layer.

14. The process of claim 13, wherein each repetition of etching, heating, and removing steps corresponds to a desired level on the surface of the substrate and each heating step forms oxide to a thickness which is proportional to a desired separation between the desired level corresponding to the repetition including the heating step and a next higher desired level on the surface of the substrate.

* * * * *